United States Patent
Sree Prakash et al.

(10) Patent No.: US 11,531,796 B2
(45) Date of Patent: Dec. 20, 2022

(54) GUIDED DESIGN GENERATION

(71) Applicant: INTERNATIONAL BUSINESS MACHINES CORPORATION, Armonk, NY (US)

(72) Inventors: Ashok Pon Kumar Sree Prakash, Bangalore (IN); Meenakshi Ravisankar, Vijayawada (IN); Amith Singhee, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 144 days.

(21) Appl. No.: 16/994,794

(22) Filed: Aug. 17, 2020

(65) Prior Publication Data

US 2022/0050939 A1  Feb. 17, 2022

(51) Int. Cl.
*G06F 30/20* (2020.01)
*G06F 17/16* (2006.01)

(52) U.S. Cl.
CPC ............ *G06F 30/20* (2020.01); *G06F 17/16* (2013.01)

(58) Field of Classification Search
CPC ................................. G06F 30/20; G06F 17/16
See application file for complete search history.

(56) References Cited

U.S. PATENT DOCUMENTS

| | | | |
|---|---|---|---|
| 2015/0220311 A1* | 8/2015 | Salter | G06F 8/34 717/105 |
| 2017/0139894 A1* | 5/2017 | Welch | G06Q 10/0639 |
| 2019/0251612 A1 | 8/2019 | Fang | |
| 2019/0347831 A1* | 11/2019 | Vishnu Vardhan | G06N 3/0454 |

FOREIGN PATENT DOCUMENTS

WO  2019073267 A1  4/2019

OTHER PUBLICATIONS

Kang WC, Fang C, Wang Z, McAuley J. Visually-aware fashion recommendation and design with generative image models. In2017 IEEE International Conference on Data Mining (ICDM) Nov. 18, 2017 (pp. 207-216). IEEE. (Year: 2017).*

Liu L, Zhang H, Ji Y, Wu QJ. Toward AI fashion design: An Attribute-GAN model for clothing match. Neurocomputing. May 14, 2019; 341:156-67. (Year: 2019).*

Ak et al, "Attribute Manipulation Generative Adversarial Networks for Fashion Images", https://www.researchgate.net/publication/335318539_Attribute_Manipul . . . ,Aug. 2019, pp. 1-4.

(Continued)

*Primary Examiner* — Chuen-Meei Gan
(74) *Attorney, Agent, or Firm* — Tihon Poltavets

(57) ABSTRACT

A method for guided design generation includes receiving a plurality of image samples for an intended design and generating a first plurality of images by providing a positive latent vector to a first layer out of a plurality of layers and a negative latent vector to remaining layers out of the plurality of layers. Responsive to receiving a first image selection, identifying the first layer out of the plurality of layers generated the first image includes a feature of interest. Determining a feature expression variation for the feature of interest in latent space based on the ranking of a first plurality of generated sample images, wherein the first plurality of generated sample images includes the feature of interest. Responsive to receiving a second plurality of images for a plurality of base features, generating an initial design based on the feature of interest and the plurality of base features.

18 Claims, 7 Drawing Sheets

(56) References Cited

OTHER PUBLICATIONS

Bau et al, "GAN Dissection: Visualizing and Understanding Generative Adversarial Networks", https://gandissect.csail.mit.edu/, Apr. 14, 2020, pp. 1-3.

Cui et al., "FashionGAN: Display your fashion design using Conditional Generative Adversarial Nets", Pacific Graphics, vol. 37 (2018), No. 7, pp. 1-11.

Disclosed Anonymously, "Few-shot learning using generative modeling", IP.com No. IPCOM000252379D, https://priorart.ip.com/IPCOM/000252379, Jan. 5, 2018, pp. 1-9.

* cited by examiner

GUIDED DESIGN GENERATION

FIELD OF INVENTION

This disclosure relates generally to design generation, and in particular to generative adversarial network based guided design generation.

BACKGROUND OF THE INVENTION

Generative adversarial network (GAN) is a class of machine learning framework that is capable of utilizing training set data to generate new output data with the same statistics as the training set data. For example, a GAN trained on an original set of images can generate a new set of images that resemble the original set of images. The new set of images can appear authentic to a human observer, having many similar characteristics to the original set of images. Presently, since image GANs are training set based, a user cannot specify requirements in a form that GANs can understand and GANs cannot seek feedback from the user to modify the new output data based on vaguely defined features.

SUMMARY

Embodiments in accordance with the present invention disclose a method, computer program product and computer system for guided design generation, the method, computer program product and computer system can responsive to receiving a plurality of positive image samples and a plurality of negative image samples for an intended design, generate a first plurality of images by providing a positive latent vector to a first layer out of a plurality of layers and a negative latent vector to remaining layers out of the plurality of layers. The method, computer program product and computer system can responsive to receiving a first image selection out of the first plurality of images, identify the first layer out of the plurality of layers generated the first image includes a feature of interest for inclusion in the intended design. The method, computer program product and computer system can determine a feature expression variation for the feature of interest in latent space based on the ranking of a first plurality of generated sample images, wherein the first plurality of generated sample images includes the feature of interest. The method, computer program product and computer system can responsive to receiving a second plurality of images for a plurality of base features of the intended design, generate an initial design based on the feature of interest and the plurality of base features.

DETAILED DESCRIPTION

Embodiments of the present invention provide a method that guides generative models (e.g., generative adversarial network (GANs)) to generate designs based on user feedback, where the user interacts with the generative models by providing feature requirements without understanding the workings of latent vectors and the latent space. The user is able to provide examples (i.e., images of jewelry) that include or exclude specific features to be included in a generated design and feedback as to a level of expression for each of the specific features to be included in the generated design. Embodiments of the present invention allow for user-based interactions to generate designs with various levels of features even when multiple features are embedded in a single latent vector by querying the user about levels of expression for specific features in sample generated images. The sample images are generated from multiple single features latent vectors to allow for the user to provide feedback as to an appropriate level of expression. Over time embodiments of the present invention learns various features for inclusion in a generated design based on the user provided feedback. Furthermore, embodiments of the present invention allow for a user to define threshold limits for the various features of the generated design to generate a collection of one or more other designs.

Figure 1:
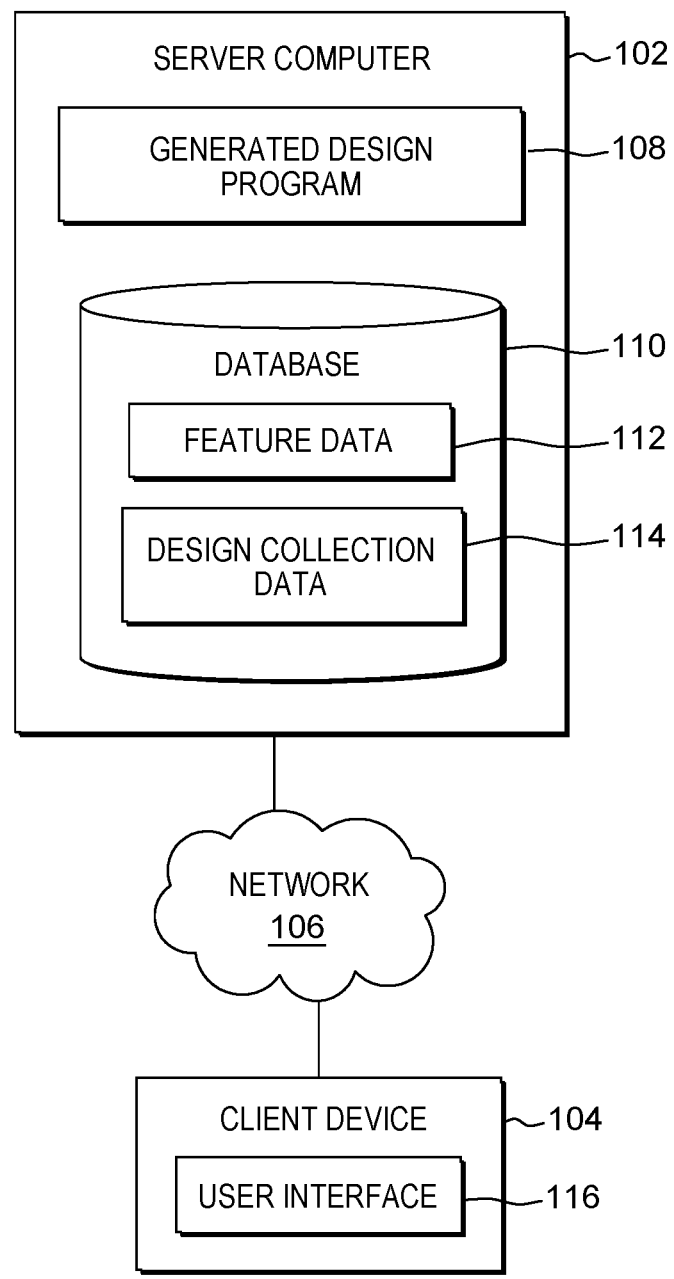
FIG. 1 is a functional block diagram illustrating a distributed data processing environment, in accordance with an embodiment of the present invention.

FIG. 1 is a functional block diagram illustrating a distributed data processing environment, in accordance with one embodiment of the present invention. The distributed data processing environment includes server computer 102 and client device 104 all interconnected over network 106.

Server computer 102 may be a desktop computer, a laptop computer, a tablet computer, a specialized computer server, a smartphone, or any computer system capable of executing the various embodiments of generated design program 108. In certain embodiments, server computer 102 represents a computer system utilizing clustered computers and components that act as a single pool of seamless resources when accessed through network 106, as is common in data centers and with cloud computing applications. In general, server computer 102 is representative of any programmable electronic device or combination of programmable electronic devices capable of executing machine-readable program instructions and communicating with other computer devices via a network. Server computer 102 has the ability to communicate with other computer devices (not illustrated in FIG. 1) to query the computer devices for information. In this embodiment, server computer 102 includes generated design program 108 capable of communicating with database 110, where database 110 includes feature data 112 and design collection data 114.

Client device 104 may be a cellphone, smartphone, smartwatch, laptop, tablet computer, or any other electronic device capable of communicating via network 106. In general, client device 104 represents one or more programmable electronic devices or combination of programmable electronic devices capable of executing machine readable program instructions and communicating with other computing devices (not shown) within distributed data processing environment via a network, such as network 106. In one embodiment, client computing device 104 represents one or more devices associated with a user. Client device 104 includes user interface 116, where user interface 116 enable a user of client device 104 to interact with generated design program 108 on server computer 102.

Generated design program 108 guides generative models (e.g., GANs) to generate designs that include features identified by a user, by allowing the generative models to interact with the user to understand specific feature requirements for instances when the generative model is not trained on for the specific feature requirements. Generated design program 108 initializes by sourcing positive and negative samples for an intended design, where the positive samples influence the intended design and the negative samples are avoided by the intended design. Generated design program 108 identifies a layer for generating a feature of the intended design and determines a feature expression variation for the feature of the intended design in latent space. Generated design program 108 refines the feature of the intended design with user feedback utilizing multiple examples (e.g., images of previous designs) and stores a representation for the feature of the intended design for future utilization, where generated design program 108 repeat the above mentioned process for each feature out of a plurality of features of the intended design. Subsequent to receiving a representation for the plurality of features of the intended design, generated design program 108 receives a level of expression for each of the plurality of features of the intended design.

Generated design program 108 determines a correlation between latent vectors and features sharing a layer and generates an initial design with the plurality of features. Generated design program 108 allows for the user to fine tune the initial design by receiving a level of expression for one or more features from the plurality of features. Based on the received level of expression for the one or more features, generated design program 108 generates a final design, where the final design includes the plurality of features provided for the intended design. Generated design program 108 further allows the user to generate a collection based on the final design and receive expression level limits that fine each feature from the plurality of features.

Database 110 is a repository for data utilized by generated design program 108 such as, feature data 112 and design collection data 114. In the depicted embodiment, database 110 resides on server computer 102. In another embodiment, database 110 may reside on client device 104 or elsewhere within distributed data processing environment provided generated design program 108 has access to database 110. Database 110 can be implemented with any type of storage device capable of storing data and configuration files that can be accessed and utilized by generated design program 108, such as a database server, a hard disk drive, or a flash memory. Feature data 112 represents a plurality of images for a plurality of design features, where a subset of a plurality of subset of images from the plurality of images are associated with a single design feature. The subset of images can include a varying a level of expression of the single design features. Feature data 112 is accessible by a user of generated design program 108 for selecting positive and negative samples for an intended design and storing design features, along with an associated level of expression. Design collection data 114 represents previously generated designs and design collections, where a design collection includes two or more designs with similar design features. Similar to feature data 112, design collection data 114 is accessible by a user of generated design program 108 for selecting positive and negative samples for an intended design and storing design features, along with an associated level of expression.

In general, network 106 can be any combination of connections and protocols that will support communications between server computer 102 and client device 104. Network 106 can include, for example, a local area network (LAN), a wide area network (WAN), such as the internet, a cellular network, or any combination of the preceding, and can further include wired, wireless, and/or fiber optic connections. In one embodiment, generated design program 108 can be a web service accessible via network 106 to a user of client device 104. In another embodiment, generated design program 108 may be operated directly by a user of server computer 102.

Figure 2:
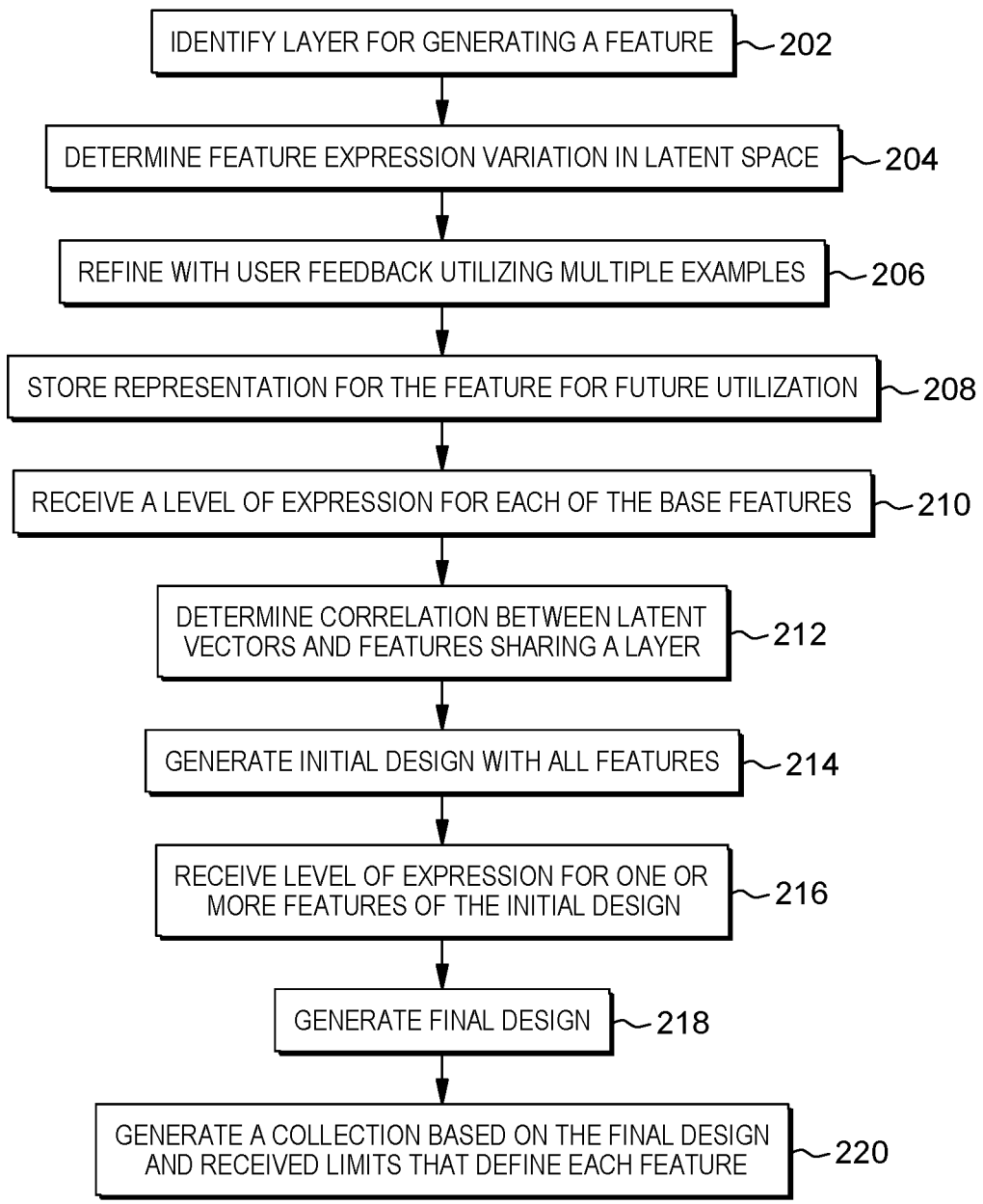
FIG. 2 is a system process flow for a generated design program, in accordance with an embodiment of the present invention.

FIG. 2 is a system process flow for a generated design program, in accordance with an embodiment of the present invention.

At block 202, generated design program 108 identifies a layer for generating a feature in an image. In one example, generated design program 108 utilizes a 1×512 latent vector for providing a feature to each level to determine which feature is produces at each level, where for example, a $1^{st}$ layer is a 2×2 feature space, a $2^{nd}$ layer is an 4×4 feature space, and an $n^{th}$ layer is a 1024×1024 feature space. Each layer is associated with a feature space (e.g., shape layer, shading layer) and generated design program 108 identifies which layer (e.g., $3^{rd}$ layer) generated the feature (e.g., shading layer). At block 204, generated design program 108 determines a feature expression variation in latent space. Subsequent to identifying a layer which generates the feature, generated design program 108 determines how the feature (e.g., shading) varies in the latent space (e.g., lighter shade vs darker shade).

At block 206, generated design program 108 refines the feature with user feedback utilizing multiple examples. The multiple exampled represent images of varying expression for the feature, where the user can provide generated design program 108 images of an intended level of expression for the feature. Generated design program 108 can also provide a plurality of images (i.e., multiple examples) of the feature (e.g., shading) and the user can rank the plurality of images based on the intended level of expression for the feature, where a higher ranked image is the closest reflection of the intended level of expression for the feature and a lower ranked image is the furthest reflection of the intended level of expression for the feature. At block 208, generated design program 108 stores a representation for the feature for future utilization when generating a final design. The representation can include one or more images provided by the user during the refinement through user feedback in block 206. Generated design program 108 repeats the above discussed process from block 202 through block 208 until all features for the intended design are identified and an expression for all of the features is established.

At block 210, generated design program 108 receives a level of expression for each of the base features. The base features represent all of the features for the intended design, where generated design program 108 allows for the user to increase or decrease a level of expression for each of the base features of the intended design. At block 212, generated design program 108 determines a correlation between latent vectors and features sharing a layer. To determine a correlation, generated design program 108 can generate an image with a centroid of the latent points representing the images that had the features sharing layer (e.g., shading and color). Generated design program 108 can receive a level of expression for each feature that shares a layer and can generate an image by feeding the deducted latent vectors for the appropriate layer.

At block 212, generated design program 108 generates an initial design with all the features and at block 214, receives a level of expression for one or more features of the initial design. Generated design program 108 allows for the user to fine tune the initial design by increasing or decreasing a level of expression for one or more features of the initial design (e.g., increase shading, decrease sizing). At block 218, generated design program 108 generates a final design based on the fine tuning done by the user by receiving a level of expression alteration for one or more features of the initial design. At block 220, generated design program 108 provides the option of generating a collection based on the final design and received limits that define each feature. Responsive to receiving limits that define a level of expression of each feature of the generated final design, generated design program 108 can generate a collection of one or more other designs based on the final design and the received limits for the level of expression for each feature.

Figure 3A:
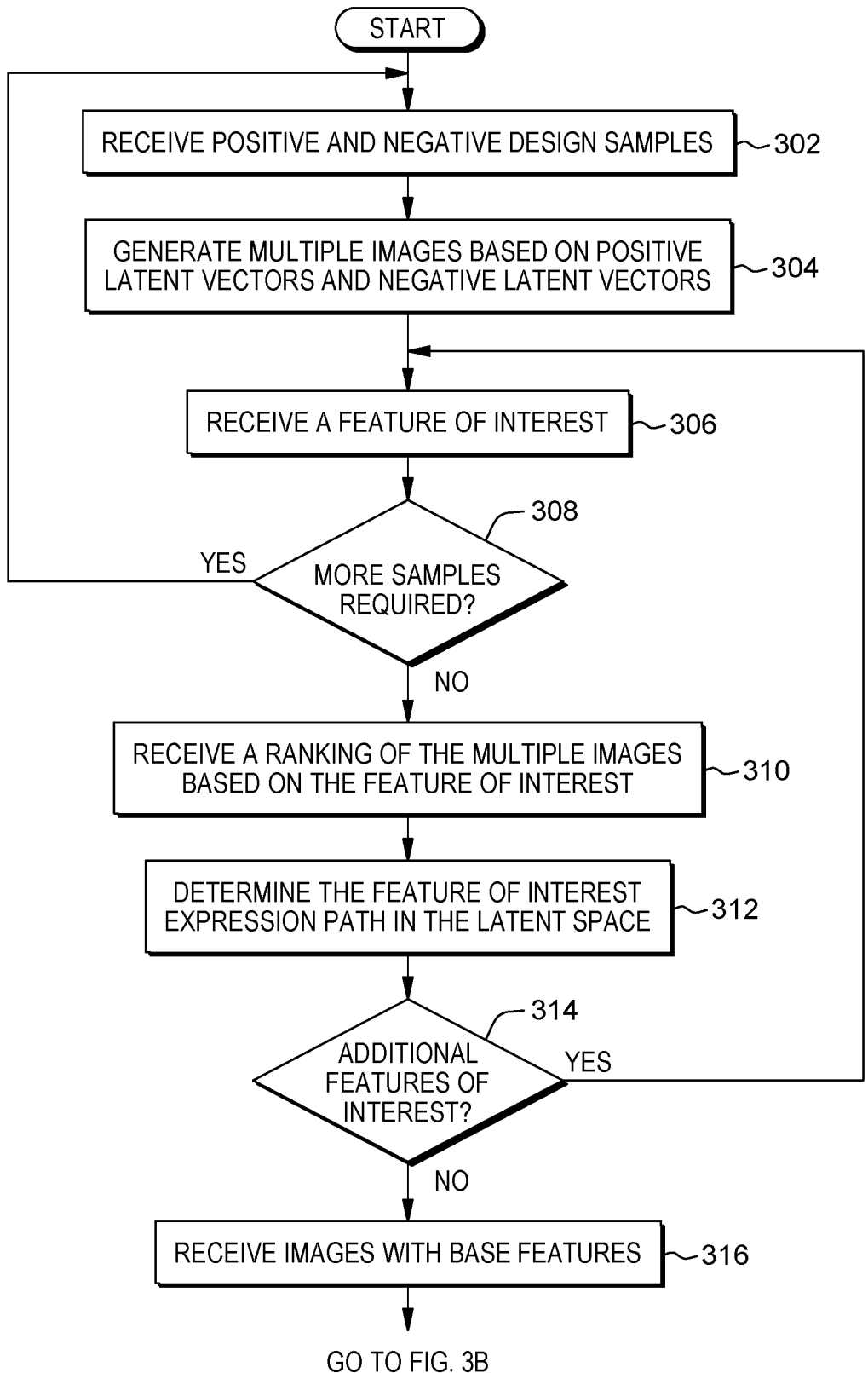
FIG. 3A is a flowchart depicting operational steps of a generated design program for guided design generation, in accordance with an embodiment of the present invention.

FIG. 3A is a flowchart depicting operational steps of a generated design program for guided design generation, in accordance with an embodiment of the present invention.

Generated design program 108 receives positive and negative design samples (302). Generated design program 108 receives positive and negative design samples based on a user selection for an intended design, where a positive sample is an image of a design with a feature to be included in an intended design and a negative sample is an image of a design that omits the feature to be included in the intended design. Generated design program 108 can display a database catalog of design samples from which a user can select the positive and negative sample, where the design samples were utilized in one or more previous sessions by generated design program 108. Alternatively, a user can source images for the positive and negative design samples from various publicly available images and generated design program 108 can receive the positive and negative design samples sourced from the user.

Generated design program 108 generates multiple images based on positive latent vectors and negative latent vectors. Prior to generating multiple images based on positive latent vectors and negative latent vectors, generated design program 108 identifies a layer for generating the feature for which the positive and negative samples were received by reconstructing and obtaining corresponding latent vectors. Generated design program 108 generates multiple images, where each image is generated by providing a positive latent vector to one layer and negative latent vector to the other layers.

Generated design program 108 receives a feature of interest (306). Generated design program 108 displays the generated multiple images and receives an image selection by the user, where the image selected includes the feature of interest to be included in the intended design. Generated design program 108 identifies a layer of interest for the feature by identifying the layer that generated the image with the feature of interest. However, there may be instances where generated design program 108 cannot identify the layer of interest for the feature and additional samples for the feature of interest are required.

Generated design program 108 determines whether more samples for the feature of interest are required (decision 308). In the event generated design program 108 determines more samples for the features of interest are not required ('no' branch, decision 308), generated design program 108 receives a ranking of the multiple images based on the feature of interest (310). In the event generated design program 108 determines more samples for the features of interest are required ('yes' branch, decision 308), generated design program 108 reverts back and receives positive and negative design samples (302).

Generated design program 108 receives a ranking of the multiple images based on the feature of interest (310). Generated design program 108 displays to the user a reduced list of sample images similar (i.e., positive vector) to the previously selected image by the user that represented the feature of interest, while shifting away from displaying dissimilar images (i.e., negative vector). A user has the ability to rank the reduced list of sample images based on a level of expression for the feature being evaluated, where a higher ranked image is the closest reflection of the intended level of expression for the feature and a lower ranked image is the furthest reflection of the intended level of expression for the feature.

Generated design program 108 determines the feature of interest expression path in the latent space (312). Based on the received ranking of the multiple images, generated design program 108 determines the feature expression path in the latent space and combining any previous expression for the same feature of interest if available. Generated design program 108 can revert and repeat the request to obtain additional clarity by sampling around an area of progression by asking the user additional questions with regards to the feature of interest. Generated design program 108 tags the feature with an attribute level and also captures if the feature of interest is generic or user specific.

Generated design program 108 determines whether there are additional features of interest (decision 314). For example, if the initial feature of interest was shading for the intended design, the additional features of interest can include items such as, shape and color. In the event generated design program 108 determines there are no additional features of interest ('no' branch, decision 314), generated design program 108 receives images with base features (316). In the event generated design program 108 determines there are additional features of interest ('yes' branch decision 314), generated design program 108 reverts back and receives a feature of interest (306).

Generated design program 108 receives images with base features (316). Generated design program 108 queries the user via the user interface for images representing remaining base features which weren't previously provided by the user. Generated design program 108 receives the images with the base features from the user, where each image from the received images is associated with a single base feature. If generated design program 108 determines there is a single layer sharing two or more features, generated design program 108 feeds the vector to each feature and generates another image with a centroid of the latent vector representing the images that had the features.

Figure 3B:
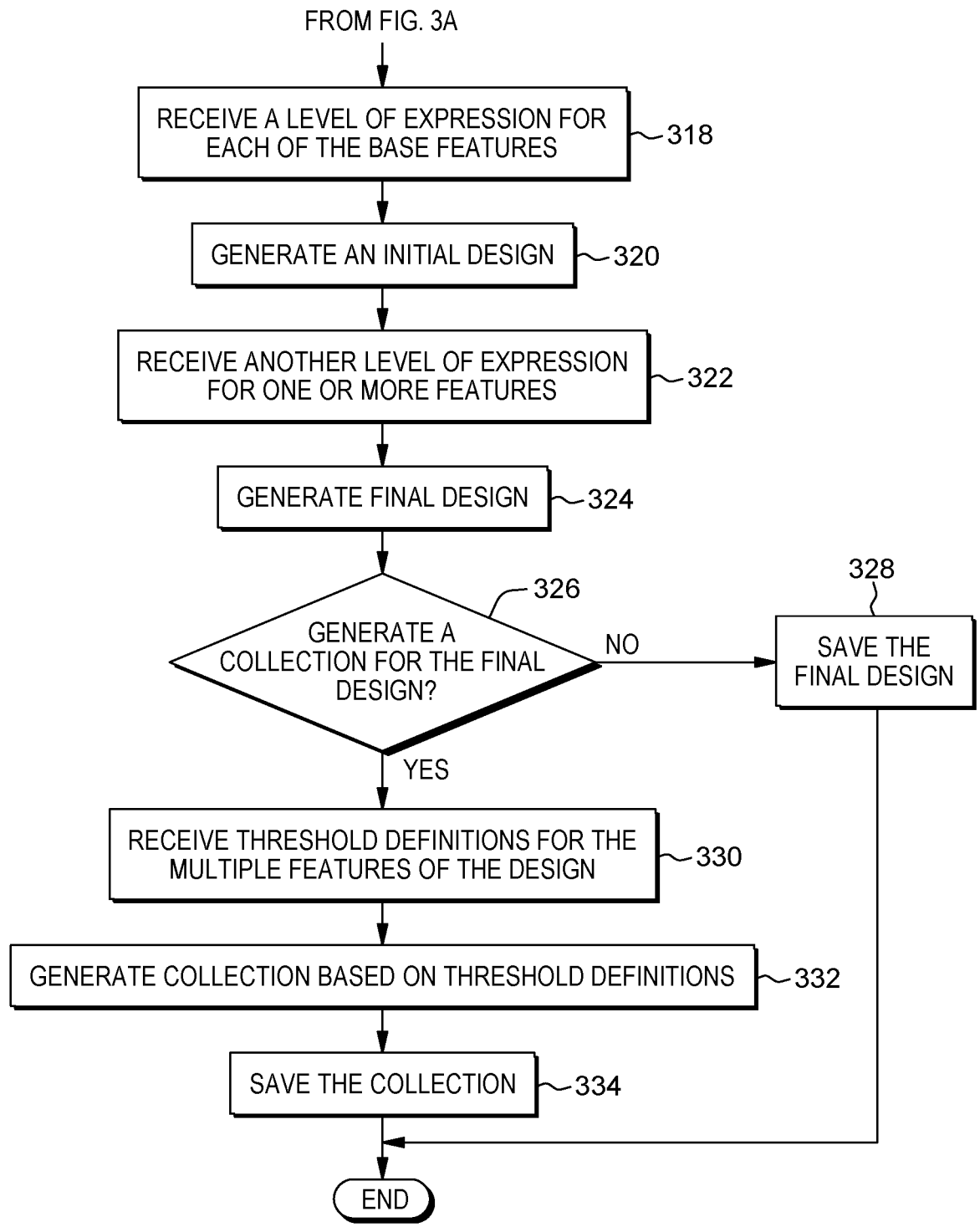
FIG. 3B is a continuation of the flowchart in FIG. 3A depicting operational steps of a generated design program for guided design generation, in accordance with an embodiment of the present invention.

FIG. 3B is a continuation of the flowchart in FIG. 3A depicting operational steps of a generated design program for guided design generation, in accordance with an embodiment of the present invention.

Generated design program 108 receives a level of expression for each of the base features (318). Generated design program 108 queries the user for feedback regarding how the centroid image represents a level of expression for each of the features. Generated design program 108 allows the user to describe a level of expression for each feature and navigates along the features expression path to obtain a desired level of feature expression for each feature. In one embodiment, generated design program 108 displays the centroid image in the user interface and a list of the features for the design in the centroid image, where a user adjustable slider is present next to each feature from the list of features to set a desired level of expression for each feature. The slider is scaled (e.g. zero to ten), where a higher value (e.g., ten) emphasizes the feature and a lower value (e.g., one) de-emphasize the feature.

Generated design program 108 generates an initial design (320). Generated design program 108 generates the initial design with all the features by feeding the deducted latent vectors for the appropriate layers associated with the features. Generated design program 108 receives another level of expression for one or more features (322). Generated design program 108 allows for the user to adjust a level of expression for one or more feature from all the features to fine tune the initial design according to user preference and an intended design. Similar to (318), generated design program 108 can display the initial design in the user interface and a list of the features for the initial design, where a user adjustable slider is present next to each feature from the list of features to set a desired level of expression for each feature. The slider is scaled (e.g. zero to ten), where a higher value (e.g., ten) emphasizes the feature and a lower value (e.g., one) de-emphasize the feature. Generated design program 108 generates a final design (324).

Generated design program 108 determines whether to generate a collection for the final design (decision 326). In the event generated design program 108 determines not to generate a collection for the final design ('no' branch, decision 326), generated design program 108 saves the final design (328) and the various images and user provided level of expressions for the plurality of features utilized for the creating the generated design. In the event generated design program 108 determines to generate a collection for the final design ('yes' branch, decision 326), generated design program 108 receives threshold definitions for the multiple features of the design (330). To generate a collection of one or more addition designs based on the generated final design, generated design program 108 receives threshold definitions for each of the features of the generated final design. The threshold definitions represent a range for a level of expression for each of the features. For example, generated design program 108 can display the generated design in the user interface and a list of the features for the initial design, where a user adjustable slider with a lower limit and an upper limit present next to each feature from the list of features to set threshold definition limits for the level of expression for each feature. The slider is scaled (e.g. zero to ten), where a user can set a higher limit (e.g., eight) for a given feature and a lower limit (e.g., six) for the given features.

Generated design program 108 generates a collection based on the threshold definitions (332). Based on the generated final design and the received threshold definitions for all the features, generated design program 108 generates a collection. In one embodiment, generated design program 108 receives a value from the user specifying an amount of designs for the collection and generated design program 108 generates the specified amount of designs for the collections. In another embodiment, generated design program 108 generates a plurality (e.g., 20) of designs for the collection and displays them to the user in a user interface. Generated design program 108 allows for the user to select one or more designs from the plurality of designs for the collections. Furthermore, generated design program 108 allows for the user to adjust a level of expression for one or more features of the designs generated for the collection, similar to (322). Generated design program 108 saves the generated collection and the generated final design, along with the various images and user provided level of expressions for the plurality of features utilized for the creating the generated design and the generated collection.

Figure 4A:
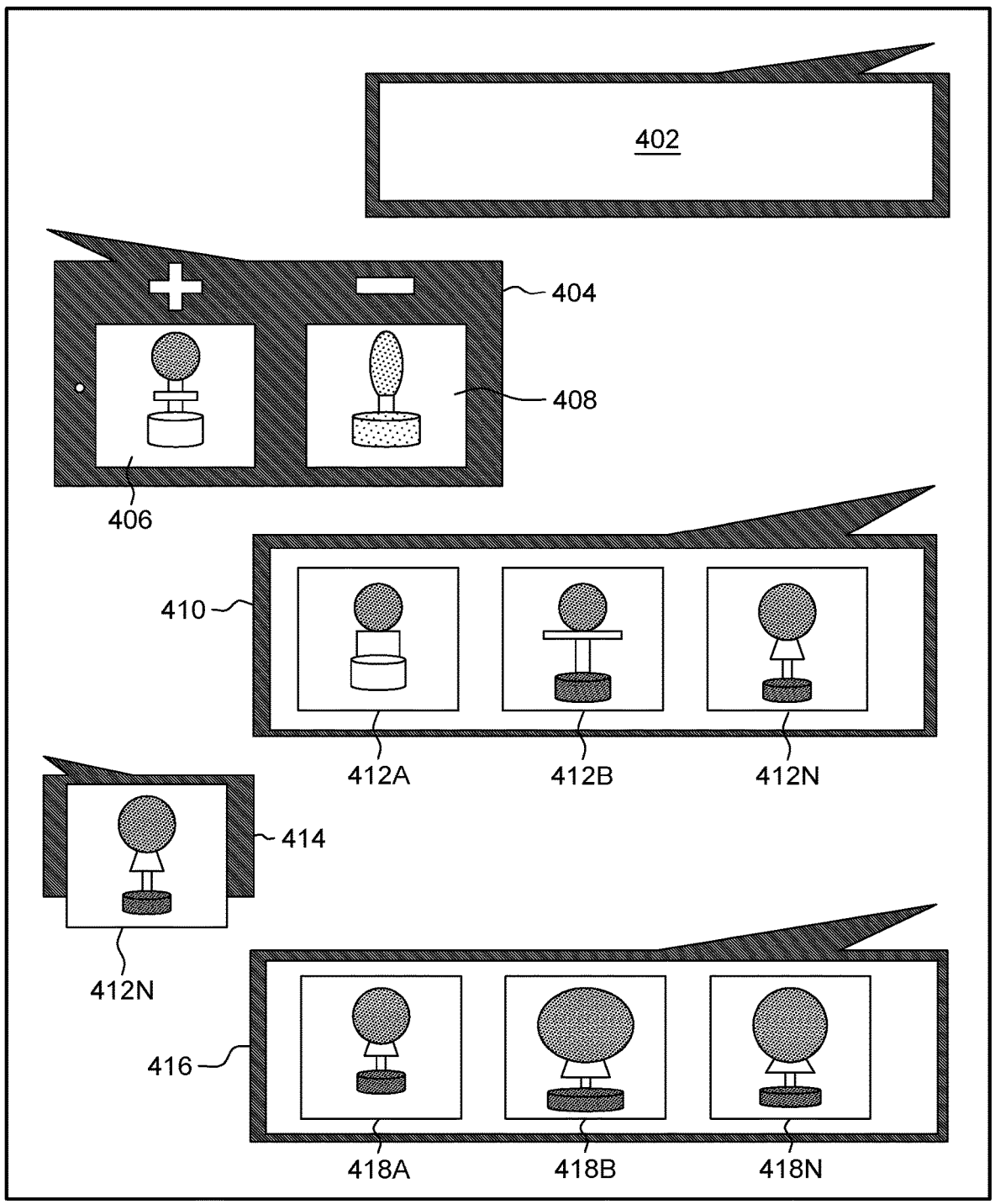
FIG. 4A is an example of a user interface for a chatbot feature of a generated design program for guided design generation, in accordance with an embodiment of the present invention.

FIG. 4A is an example of a user interface for a chatbot feature of a generated design program for guided design generation, in accordance with an embodiment of the present invention. At window 402, generated design program 108 queries the user for positive and negative design samples, where the positive design samples include features to be included in the generated final design and the negative design samples include features to be excluded from the generated final design. At window 404, generated design program 108 receives positive sample 406 and negative sample 408 via a user input. In one embodiment, generated design program 108 receives positive sample 406 and/or negative sample 408 via a selection from a feature catalog (e.g., feature data 112 from FIG. 1) stored in a database (e.g., database 110 from FIG. 1). In another embodiment, generated design program 108 receives positive sample 406 and/or negative sample 408 via an upload, where a user drags and drops the images from an online source into a corresponding positive sample column or negative sample column in window 404.

At window 410, generated design program 108 generates feature specific images 412A, 412B, and 412N, where feature specific image 412N represents the final image in the set (e.g., $20^{th}$ image or $25^{th}$ image). Generated design program 108 generates each image by feeding a positive latent vector to one layer and negative latent vectors to the other remaining layers. At window 414, generated design program 108 receives a user selection of feature specific image 412N as the image that includes the feature of interest for the intended design. At window 416, based on the user selection of feature specific image 412N, generated design program 108 generates a list of images closer to the selected image (i.e., positive latent vector), while eliminating images with negative latent vectors. Furthermore, at window 416, generated design program 108 queries the user to arrange images 418A, 418B, and 418N, where image 418N represents the final image in the set (e.g., $5^{th}$ image or $10^{th}$ image). The arrangement of images 418A, 418B, and 418N is based on an increasing level of expression of the intended feature.

Figure 4B:
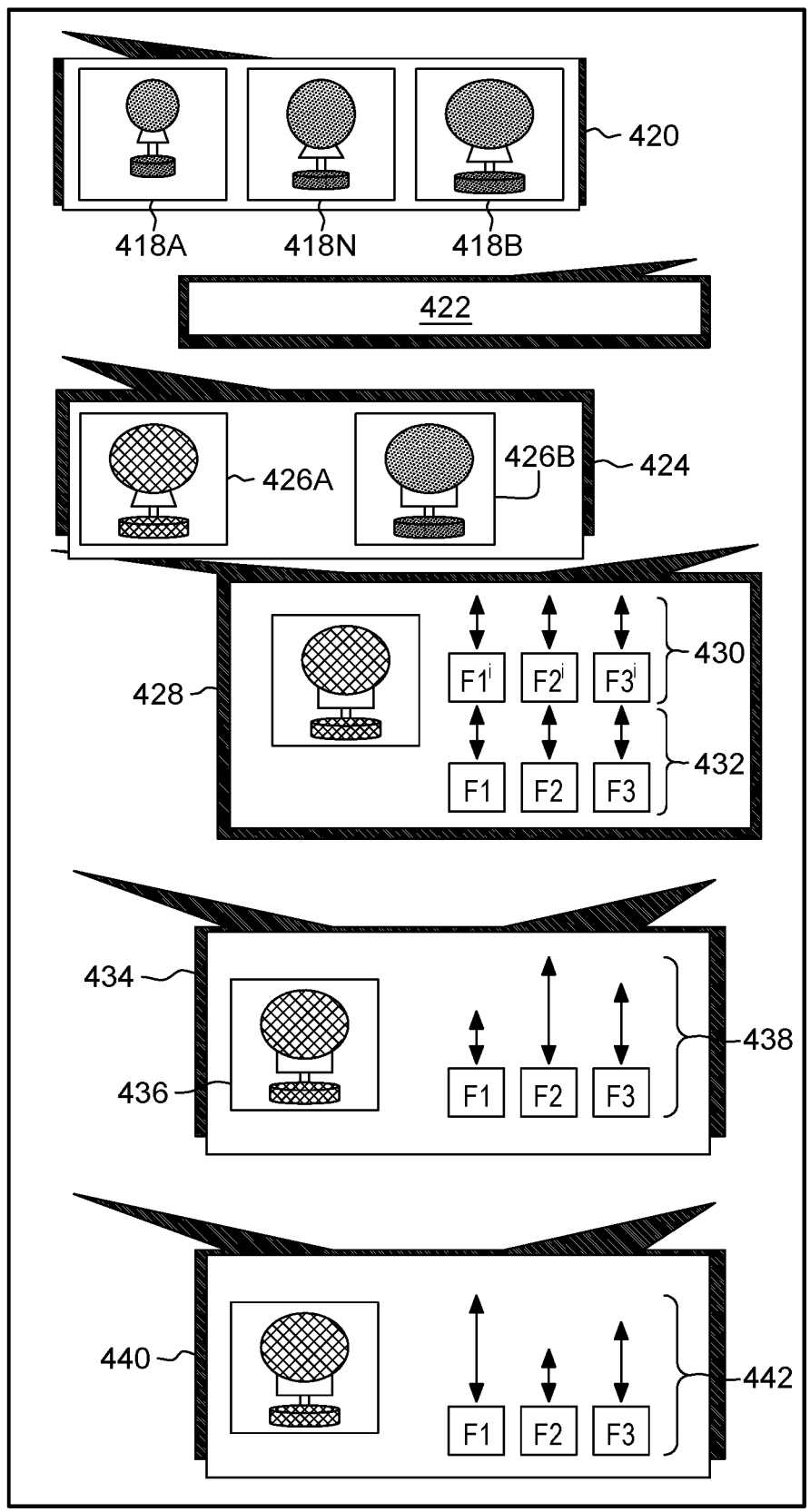
FIG. 4B is a continuation of the example of the user interface for the chatbot feature of the generated design program for guided design generation from FIG. 4A, in accordance with an embodiment of the present invention.

FIG. 4B is a continuation of the example of the user interface for the chatbot feature of the generated design program for guided design generation from FIG. 4A, in accordance with an embodiment of the present invention. At window 420, generated design program 108 receives the arranged images 418A, 418B, and 418N from the user based on the increasing level of expression for the intended features. Generated design program 108 infers the feature in the latent space and combines any previous expression of the same features. Generated design program 108 can revert and repeat the request to obtain additional clarity by sampling around an area of progression by asking the user additional questions with regards to the feature of interest. Generated design program 108 tags the feature with an attribute level and also captures if the feature of interest is generic or user specific. At window 422, generated design program 108 queries the user for images representing remaining base features which weren't previously provided by the user. At window 424, generated design program 108 receives image 426A representing a first base feature (i.e., shade of circle) and image 426B representing a second base feature (i.e., rectangle shape for base of circle). If generated design program 108 determines there is a single layer sharing two or more features, generated design program 108 feeds the latent vector to each feature and generates another image with a centroid of the latent vector representing the images that had the features.

At window 428, generated design program 108 displays current levels of expressions 430 for the base features and user adjustable levels of expressions 432 for the base features. Generated design program 108 provides a user adjustable slider for each user adjustable levels of expressions 432 for the base features, where the slider can be scaled (e.g. zero to ten). A higher value (e.g., ten) emphasizes the feature and a lower value (e.g., one) de-emphasize the feature. The user provides the intended levels of expressions for the intended design via user adjustable levels of expressions 432 and at window 434 generated design program 108 generates initial design 436 by feeding the deducted latent vectors for the appropriate layers. Generated design program 108 allows for the user to fine tune the initial design by interactively increasing or decreasing a level of expression for one or more features via user adjustable levels of expressions 438. Responsive to receiving adjustments to a level of expression for one or more features of the initial design, generated design program 108 generates the final design and stores the final design, along with any data utilized to generate the final design.

At window 440, generated design program 108 allows a user to generate a collection based on the generated final design and threshold definitions for levels of expression for multiple features. Generated design program 108 provides adjustable limit sliders 442 to allow for the user to set upper (max) and lower (min) limits (i.e., threshold definitions) for each level of expression for each feature. Generated design program 108 generates a plurality (e.g., 20) of designs for the collection and can display them to the user in the user interface. Generated design program 108 allows for the user to select one or more designs from the plurality of designs for the collections.

Figure 5:
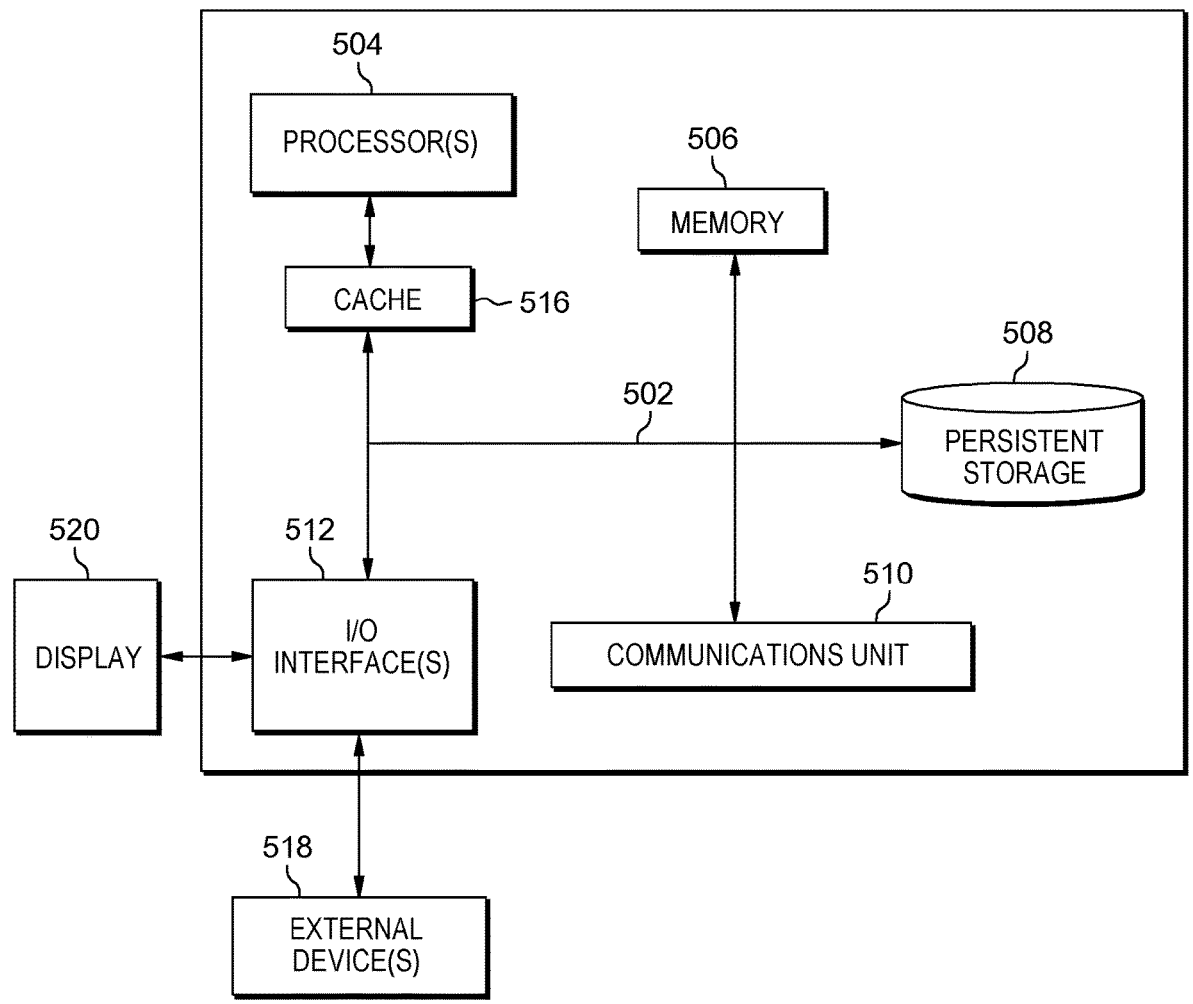
FIG. 5 is a block diagram of components of a computer system, such as the server computer of FIG. 1, in accordance with an embodiment of the present invention.

FIG. 5 depicts a computer system, where server computer 102 is an example of a computer system that can include generated design program 108. The computer system includes processors 504, cache 516, memory 506, persistent storage 508, communications unit 510, input/output (I/O) interface(s) 512 and communications fabric 502. Communications fabric 502 provides communications between cache 516, memory 506, persistent storage 508, communications unit 510, and input/output (I/O) interface(s) 512. Communications fabric 502 can be implemented with any architecture designed for passing data and/or control information between processors (such as microprocessors, communications and network processors, etc.), system memory, peripheral devices, and any other hardware components within a system. For example, communications fabric 502 can be implemented with one or more buses or a crossbar switch.

Memory 506 and persistent storage 508 are computer readable storage media. In this embodiment, memory 506 includes random access memory (RAM). In general, memory 506 can include any suitable volatile or non-volatile computer readable storage media. Cache 516 is a fast memory that enhances the performance of processors 504 by holding recently accessed data, and data near recently accessed data, from memory 506.

Program instructions and data used to practice embodiments of the present invention may be stored in persistent storage 508 and in memory 506 for execution by one or more of the respective processors 504 via cache 516. In an embodiment, persistent storage 508 includes a magnetic hard disk drive. Alternatively, or in addition to a magnetic hard disk drive, persistent storage 508 can include a solid state hard drive, a semiconductor storage device, read-only memory (ROM), erasable programmable read-only memory (EPROM), flash memory, or any other computer readable storage media that is capable of storing program instructions or digital information.

The media used by persistent storage 508 may also be removable. For example, a removable hard drive may be used for persistent storage 508. Other examples include optical and magnetic disks, thumb drives, and smart cards that are inserted into a drive for transfer onto another computer readable storage medium that is also part of persistent storage 508.

Communications unit 510, in these examples, provides for communications with other data processing systems or devices. In these examples, communications unit 510 includes one or more network interface cards. Communications unit 510 may provide communications through the use of either or both physical and wireless communications links. Program instructions and data used to practice embodiments of the present invention may be downloaded to persistent storage 508 through communications unit 510.

I/O interface(s) 512 allows for input and output of data with other devices that may be connected to each computer system. For example, I/O interface 512 may provide a connection to external devices 518 such as a keyboard, keypad, a touch screen, and/or some other suitable input device. External devices 518 can also include portable computer readable storage media such as, for example, thumb drives, portable optical or magnetic disks, and memory cards. Software and data used to practice embodiments of the present invention can be stored on such portable computer readable storage media and can be loaded onto persistent storage 508 via I/O interface(s) 512. I/O interface(s) 512 also connect to display 520.

Display 520 provides a mechanism to display data to a user and may be, for example, a computer monitor.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method comprising:
   responsive to receiving a plurality of positive image samples and a plurality of negative image samples for an intended design, generating, by one or more processors, a first plurality of images by providing a positive latent vector to a first layer out of a plurality of layers and a negative latent vector to remaining layers out of the plurality of layers;
   responsive to receiving a first image selection out of the first plurality of images, identifying, by one or more processors, the first layer out of the plurality of layers generated the first image includes a feature of interest for inclusion in the intended design;
   determining, by one or more processors, a feature expression variation for the feature of interest in latent space based on a ranking of a first plurality of generated sample images, wherein the first plurality of generated sample images includes the feature of interest;

receiving, by one or more processors, a first image out of a second plurality of images representing a first base feature out of a plurality of base features and a second image out of the second plurality of images represent a second base features out of the plurality of base features:

displaying, by one or more processors, an adjustable slider for setting a first instance of a level of expression for each base feature out of the plurality of base features;

receiving, by one or more processors, the first instance of the level of expression for each base feature out of the plurality of base features; and responsive to receiving the second plurality of images for the plurality of base features of the intended design, generating, by one or more processors, an initial design based on the feature of interest and the plurality of base features.

2. The method of claim 1, further comprising:

receiving, by one or more processors, a second instance of the level of expression for one or more of: the feature of interest and the plurality of base features;

generating, by one or more processors, a final design based on the feature of interest, the plurality of base features, and the second instance of the level of expression.

3. The method of claim 2, further comprising:

receiving, by one or more processors, a plurality of threshold definitions for the feature of interest and the plurality of base features, wherein each threshold definition of the plurality of threshold definitions includes an upper limit and a lower limit for the level of expression; and generating, by one or more processors, a collection of one or more designs based on the final design and the plurality of threshold definitions.

4. The method of claim 3, further comprising:

displaying, by one or more processors, the plurality of generated sample images in a user interface, and receiving, by one or more processors, the ranking of the first plurality of generated sample images, wherein the user arranged the plurality of generated sample images in the user interface based on the level of expression for the feature of interest in the intended design.

5. The method of claim 4, further comprising:

storing, by one or more processors, the final design, the collection of the one or more designs, the first instance of the level of expression, the second instance of the level of expression, and the plurality of threshold definitions.

6. The method of claim 1, wherein the plurality of positive image samples includes the feature of interest and the plurality of negative images exclude the feature of interest.

7. A computer program product comprising:

one or more computer readable storage media and program instructions stored on at least one of the one or more storage media, the program instructions comprising:

program instructions to, responsive to receiving a plurality of positive image samples and a plurality of negative image samples for an intended design, generate a first plurality of images by providing a positive latent vector to a first layer out of a plurality of layers and a negative latent vector to remaining layers out of the plurality of layers;

program instructions to, responsive to receiving a first image selection out of the first plurality of images, identify the first layer out of the plurality of layers generated the first image includes a feature of interest for inclusion in the intended design;

program instructions to determine a feature expression variation for the feature of interest in latent space based on a ranking of a first plurality of generated sample images, wherein the first plurality of generated sample images includes the feature of interest;

program instructions to receive a first image out of a second plurality of images representing a first base feature out of a plurality of base features and a second image out of the second plurality of images represent a second base features out of the plurality of base features;

program instructions to display an adjustable slider for setting a first instance of a level of expression for each base feature out of the plurality of base features;

program instructions to receive the first instance of the level of expression for each base feature out of the plurality of base features; and program instructions to, responsive to receiving the second plurality of images for the plurality of base features of the intended design, generate an initial design based on the feature of interest and the plurality of base features.

8. The computer program product of claim 7, further comprising program instructions, stored on the one or more computer readable storage media, which when executed by a processor, cause the processor to:

receive a second instance of the level of expression for one or more of: the feature of interest and the plurality of base features;

generate a final design based on the feature of interest, the plurality of base features, and the second instance of the level of expression.

9. The computer program product of claim 8, further comprising program instructions, stored on the one or more computer readable storage media, which when executed by a processor, cause the processor to:

receive a plurality of threshold definitions for the feature of interest and the plurality of base features, wherein each threshold definition of the plurality of threshold definitions includes an upper limit and a lower limit for the level of expression; and generate a collection of one or more designs based on the final design and the plurality of threshold definitions.

10. The computer program product of claim 9, further comprising program instructions, stored on the one or more computer readable storage media, which when executed by a processor, cause the processor to:

display the plurality of generated sample images in a user interface, and receive the ranking of the first plurality of generated sample images, wherein the user arranged the plurality of generated sample images in the user interface based on the level of expression for the feature of interest in the intended design.

11. The computer program product of claim 10, further comprising program instructions, stored on the one or more computer readable storage media, which when executed by a processor, cause the processor to:

store the final design, the collection of the one or more designs, the first instance of the level of expression, the second instance of the level of expression, and the plurality of threshold definitions.

12. The computer program product of claim 7, wherein the plurality of positive image samples includes the feature of interest and the plurality of negative images exclude the feature of interest.

13. A computer system comprising:
one or more computer processors;
one or more computer readable storage media; and
program instructions stored on the computer readable storage media for execution by at least one of the one or more computer processors, the program instructions comprising:
program instructions to, responsive to receiving a plurality of positive image samples and a plurality of negative image samples for an intended design, generate a first plurality of images by providing a positive latent vector to a first layer out of a plurality of layers and a negative latent vector to remaining layers out of the plurality of layers;
program instructions to, responsive to receiving a first image selection out of the first plurality of images, identify the first layer out of the plurality of layers generated the first image includes a feature of interest for inclusion in the intended design;
program instructions to determine a feature expression variation for the feature of interest in latent space based on a ranking of a first plurality of generated sample images, wherein the first plurality of generated sample images includes the feature of interest;
program instructions to receive a first image out of a second plurality of images representing a first base feature out of a plurality of base features and a second image out of the second plurality of images represent a second base features out of the plurality of base features;
program instructions to display an adjustable slider for setting a first instance of a level of expression for each base feature out of the plurality of base features;
program instructions to receive the first instance of the level of expression for each base feature out of the plurality of base features; and
program instructions to, responsive to receiving the second plurality of images for the plurality of base features of the intended design, generate an initial design based on the feature of interest and the plurality of base features.

14. The computer system of claim 13, further comprising program instructions, stored on the one or more computer readable storage media, which when executed by a processor, cause the processor to:
receive a second instance of the level of expression for one or more of: the feature of interest and the plurality of base features;
generate a final design based on the feature of interest, the plurality of base features, and the second instance of the level of expression.

15. The computer system of claim 14, further comprising program instructions, stored on the one or more computer readable storage media, which when executed by a processor, cause the processor to:
receive a plurality of threshold definitions for the feature of interest and the plurality of base features, wherein each threshold definition of the plurality of threshold definitions includes an upper limit and a lower limit for the level of expression; and
generate a collection of one or more designs based on the final design and the plurality of threshold definitions.

16. The computer system of claim 15, further comprising program instructions, stored on the one or more computer readable storage media, which when executed by a processor, cause the processor to:
display the plurality of generated sample images in a user interface, and
receive the ranking of the first plurality of generated sample images, wherein the user arranged the plurality of generated sample images in the user interface based on a level of expression for the feature of interest in the intended design.

17. The computer system of claim 16, further comprising program instructions, stored on the one or more computer readable storage media, which when executed by a processor, cause the processor to:
store the final design, the collection of the one or more designs, the first instance of the level of expression, the second instance of the level of expression, and the plurality of threshold definitions.

18. The computer system of claim 13, wherein the plurality of positive image samples includes the feature of interest and the plurality of negative images exclude the feature of interest.

* * * * *